US012772382B2

(12) United States Patent
Koiwa et al.

(10) Patent No.: US 12,772,382 B2
(45) Date of Patent: Oct. 20, 2026

(54) RESTRICTING DEVICE FOR FLEXIBLE WIRING BOARD AND DISPLAY DEVICE USING THE RESTRICTING DEVICE

(71) Applicant: ALPS ALPINE CO., LTD., Tokyo (JP)

(72) Inventors: Ken Koiwa, Fukushima (JP); Tomoki Otsuka, Fukushima (JP); Masanori Komatsu, Fukushima (JP); Kei Furuta, Fukushima (JP); Hotaka Ojima, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 177 days.

(21) Appl. No.: 18/917,148

(22) Filed: Oct. 16, 2024

(65) Prior Publication Data

US 2025/0133660 A1 Apr. 24, 2025

(30) Foreign Application Priority Data

Oct. 18, 2023 (JP) ................................ 2023-179706

(51) Int. Cl.

*H01R 12/79* (2011.01)
*H05K 1/189* (2026.01)
*H05K 5/00* (2006.01)

(52) U.S. Cl.

CPC ............. *H05K 1/189* (2013.01); *H01R 12/79* (2013.01); *H05K 5/0018* (2022.08); *H05K 2201/056* (2013.01)

(58) Field of Classification Search

CPC .. H05K 1/189; H05K 5/0018; B60R 16/0215; H02G 3/30; H02G 3/32; H01R 12/79; G02F 220/465

See application file for complete search history.

(56) References Cited

U.S. PATENT DOCUMENTS

2003/0193787 A1 10/2003 Manabe et al.
2005/0101052 A1* 5/2005 Kobayashi ........... H05K 3/0052 438/106

(Continued)

FOREIGN PATENT DOCUMENTS

JP 2000-277880 10/2000
JP 4827971 11/2011
JP 5569345 8/2014

OTHER PUBLICATIONS

Extended European Search Report for 24206786.6 mailed on Feb. 26, 2025.

*Primary Examiner* — Paresh Paghadal
(74) *Attorney, Agent, or Firm* — IPUSA, PLLC

(57) ABSTRACT

A restricting device for a flexible wiring board includes an insertion portion into which at least both side portions of the flexible wiring board are inserted. The insertion portion includes: a rear restricting portions protruding in a thickness direction of the flexible wiring board; a front restricting portion located forward of the rear restricting portion in an insertion direction; a restricting region formed between the front restricting portion and the rear restricting portion, and an inner restricting portion located further inward than the rear restricting portion with respect to a width direction of the flexible wiring board and protruding in a direction opposite to a protruding direction of the rear restricting portion. The protruding portion passes over the rear restricting portion and is restricted from moving in a front-rear direction in the restricting region while the flexible wiring board is being inserted into the insertion portion.

6 Claims, 10 Drawing Sheets

(56) References Cited

U.S. PATENT DOCUMENTS

| | | | | |
|---|---|---|---|---|
| 2006/0152664 | A1* | 7/2006 | Nishio | G02F 1/13452 349/150 |
| 2010/0202119 | A1 | 8/2010 | Nagami et al. | |
| 2013/0052842 | A1* | 2/2013 | Yu | H01R 13/516 439/55 |
| 2014/0065853 | A1 | 3/2014 | Murakami | |
| 2018/0292081 | A1* | 10/2018 | Chou | F21V 33/0048 |

* cited by examiner

RESTRICTING DEVICE FOR FLEXIBLE WIRING BOARD AND DISPLAY DEVICE USING THE RESTRICTING DEVICE

CROSS-REFERENCE TO RELATED APPLICATIONS

Priority is claimed to Japanese Patent Application No. 2023-179706, filed Oct. 18, 2023, the entire content of which is incorporated herein by reference.

BACKGROUND

1. Technical Field

The present disclosure relates to a restricting device for a flexible wiring board that can restrict moving of a flexible wiring board in a pulling direction in response to a pulling force or the like acting on the flexible wiring board, and a display device using the restricting device.

An assembly process of a display device, for example, requires work of inserting a flexible wiring board extending from a display panel into a holder and connecting a connecting portion of the flexible wiring board provided at a front end of an insertion direction to a connector provided inside the holder. If an excessive pulling force is applied to the flexible wiring board during this work, an excessive stress acts on a connecting portion between the display panel and the flexible wiring board, and there is a possibility that the connecting portion is damaged or the display panel is cracked. In order to prevent such a consequence, it is preferable to provide a restricting device in the holder to restrict excessive movement of the flexible wiring board to be inserted.

SUMMARY

In one aspect, the present disclosure relates to a restricting device for a flexible wiring board, and the restricting device includes an insertion portion into which at least both side portions of the flexible wiring board are inserted in a direction along a board surface of the flexible wiring board. The side portions of the flexible wiring board are formed with: edge portions positioned on respective sides in a width direction intersecting an insertion direction in which the flexible wiring board is inserted into the insertion portion; and protruding portions protruding from the respective edge portions outward in the width direction. The insertion portion includes: a rear restricting portion protruding in a thickness direction of the flexible wiring board; a front restricting portion located forward of the rear restricting portion in the insertion direction; a restricting region formed between the front restricting portion and the rear restricting portion; and an inner restricting portion located further inward than the rear restricting portion with respect to a width direction of the flexible wiring board and protruding in a direction opposite to a protruding direction of the rear restricting portion. The protruding portion passes over the rear restricting portion and is restricted from moving in a front-rear direction in the restricting region while the flexible wiring board is being inserted into the insertion portion.

In another aspect, a display device according to the present disclosure includes: a holder; a display panel fixed to the holder; and the restricting device for a flexible wiring board described above. The flexible wiring board is inserted into the insertion portion and restricted, being bent at the display panel toward the holder.

DETAILED DESCRIPTION

Figure 1:
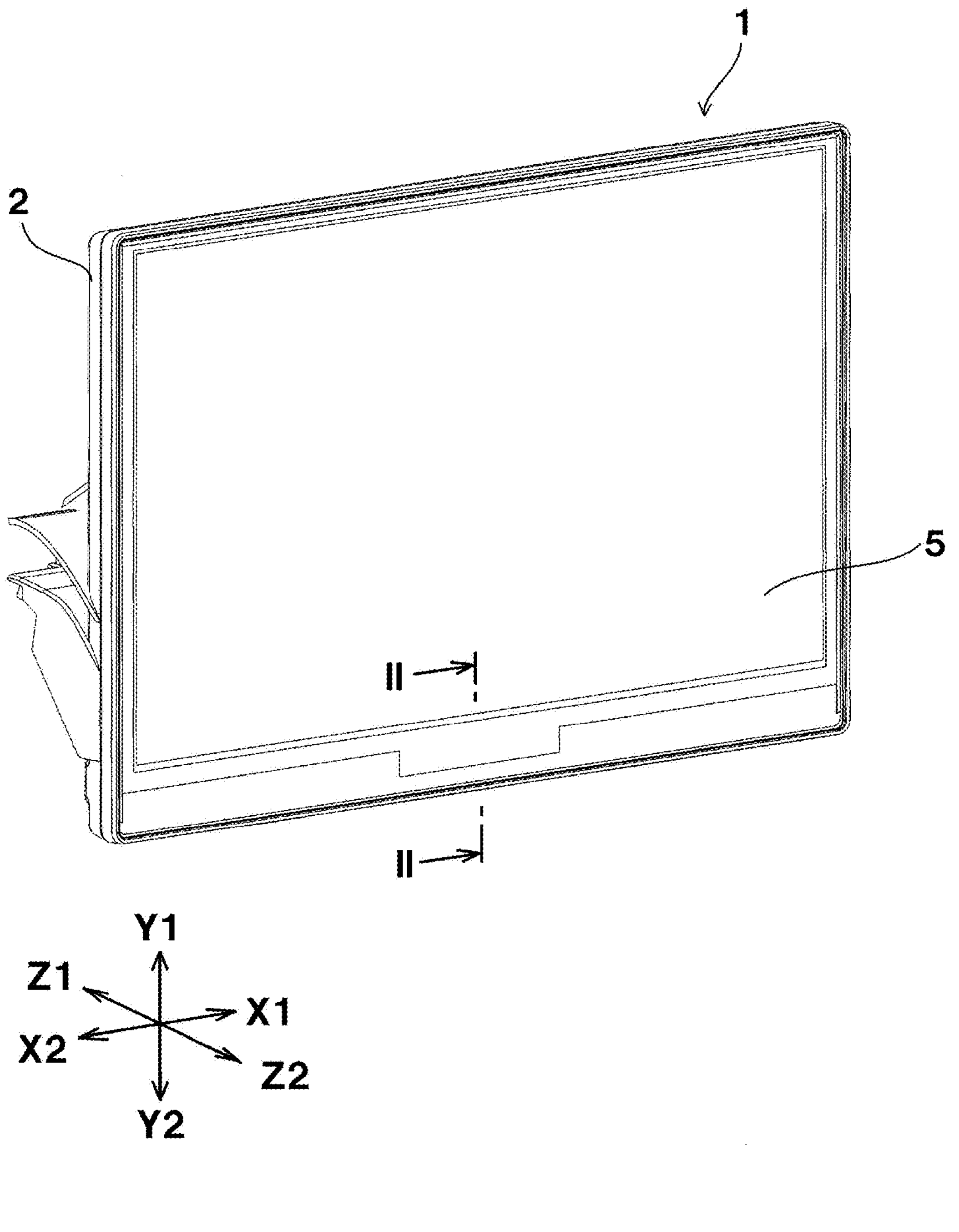
FIG. 1 is a perspective view illustrating a display device of an embodiment.

Japanese Patent No. 4827971 (hereinafter "Patent Document 1") describes an invention related to a flexible wiring board fixing structure. In the fixing structure illustrated in FIGS. 1 through 4 of Patent Document 1, a rectangular opening is formed at two positions on a substrate on which a connector is mounted. The flexible wiring board is formed with a pair of locking members protruding in both directions orthogonal to the direction of inserting the board into the connector, and the locking members are respectively positioned in the openings when the connection terminal portion of the flexible wiring board is fitted to the connector. The locking members being inserted into the openings prevent the flexible wiring board from moving in the horizontal direction and the vertical direction. In the fixing structure described in FIGS. 7 through 10 of Patent Document 1, a T-shaped opening is formed in a substrate on which a connector is mounted, and the opening has a pair of locking pieces facing each other at an open portion. After the connection terminal portion of the flexible wiring board is fitted to the connector, the flexible wiring board is inserted into the open portion between the pair of locking pieces and is positioned in the opening, with the pair of locking members of the flexible wiring board being positioned on the surface of the substrate. This prevents the connection terminal portion from being pulled out from the connector.

In the display device described in Japanese Patent No. 5569345 (hereinafter "Patent Document 2"), a liquid crystal display panel is fixed to a housing. A locking protrusion having a head part and a column part is provided on the outer side surface of the housing. A flexible wiring board connected to a terminal array part of the liquid crystal display panel is formed with a locked hole and a slit extending from the locked hole. The flexible wiring board is bent along the outer side surface of the housing, and the locked hole is made to pass over the head portion of the locking protrusion so as to fit to the column portion of the locking protrusion, and the flexible wiring board is thereby locked to the locking protrusion so as not to be detached.

The fixing structure described in FIGS. 1 through 4 of Patent Document 1 requires complicated work of bending each of the pair of locking pieces integrated with the flexible wiring board and inserting the locking pieces into the respective openings, after fitting the connection terminal portion of the flexible wiring board to the connector. In an intermediate process of fitting the flexible wiring board to the connector during a whole assembly process, it is ideal to be able to position the flexible wiring board only by inserting or pushing the flexible wiring board in a direction along the board surface; however, such an intermediate process cannot be realized with the above-described fixing structure. In the fixing structure described in FIGS. 7 through 10 of Patent Document 1, the wiring operation of the flexible wiring board is further complicated, as it requires work of forcibly pushing the flexible wiring board into the open portion between the pair of locking pieces, while being bent, after the connection terminal portion of the flexible wiring board is fitted to the connector.

In the display device described in Patent Document 2, the wiring work of the flexible wiring board is further complicated, as it requires work of bending the flexible wiring board connected to the terminal array portion of the liquid crystal display panel along the outer side surface of the housing, getting the locked hole to pass over the head portion of the locking protrusion so as to fit to the column portion of the locking protrusion.

The present disclosure has been proposed to solve the above-mentioned conventional problems, and an objective of the present disclosure is to provide a restricting device for a flexible wiring board, which can reliably restrict the flexible wiring board so as not to come off through a simple work of inserting the flexible wiring board into an insertion portion in a direction along its board surface, and a display device using the restricting device.

The restricting device for a flexible wiring board according to the present disclosure can be configured in such a manner that a vertex portion of the inner restricting portion is located at an intermediate height position between a vertex portion and a base portion of the rear restricting portion. While the flexible wiring board being inserted into the insertion portion, a tip portion of the protruding portion is abutted to the rear restricting portion, and a portion located further inward than the tip portion with respect to a width direction is abutted to the inner restricting portion and is thereby bent and deformed. In an insertion process, the protruding portion enters the restricting region by an elastic resilience force caused by a disengagement of the front end from the rear restricting portion.

It is preferable that the restricting device for a flexible wiring board according to the present disclosure be configured in such a manner that the rear restricting portion is formed with an inclined portion inclined forward in the insertion direction from the base portion to the vertex portion of the rear restricting portion.

It is preferable that the restricting device for a flexible wiring board according to the present disclosure is configured in such a manner that the tip portion of the protruding portion is formed with a thin piece portion having a reduced dimension in the front-rear direction, and the thin piece portion is abutted to the rear restricting portion.

It is preferable that the restricting device for a flexible wiring board according to the present disclosure be configured in such a manner that the thin piece portion is formed with a front protruding piece protruding forward, the insertion portion is formed with a front opening aligned with the front restricting portion, and the front protruding piece is positioned in the front opening as the protruding portion enters the restricting region.

In the flexible wiring board restricting device of the present disclosure, it is possible to insert the protruding portions formed on both side portions of the flexible wiring board into the restricting region in the insertion portion only by inserting the flexible wiring board into the insertion portion in the direction along the board surface, without work of bending a part of the flexible wiring board by hand to lock the flexible wiring board. The protruding portions in the restricting region are restricted from moving in the front-rear direction between the rear restricting portion and the front restricting portion, and the inner restricting portion can restrict the protruding portions from coming off from the restricting region.

In the display device of the present disclosure, since the protruding portions of the flexible wiring board extending from the display panel are restricted by the restricting device at the time of inserting the flexible wiring board into the holder, an excessive stress is not applied to a connecting portion between the flexible wiring board and the display panel, even if the flexible wiring board is pulled toward the inside of the holder using a jig or a tool. Therefore, it is easy to prevent the connecting portion from being damaged or a part of the display panel from being damaged.

Figure 2:
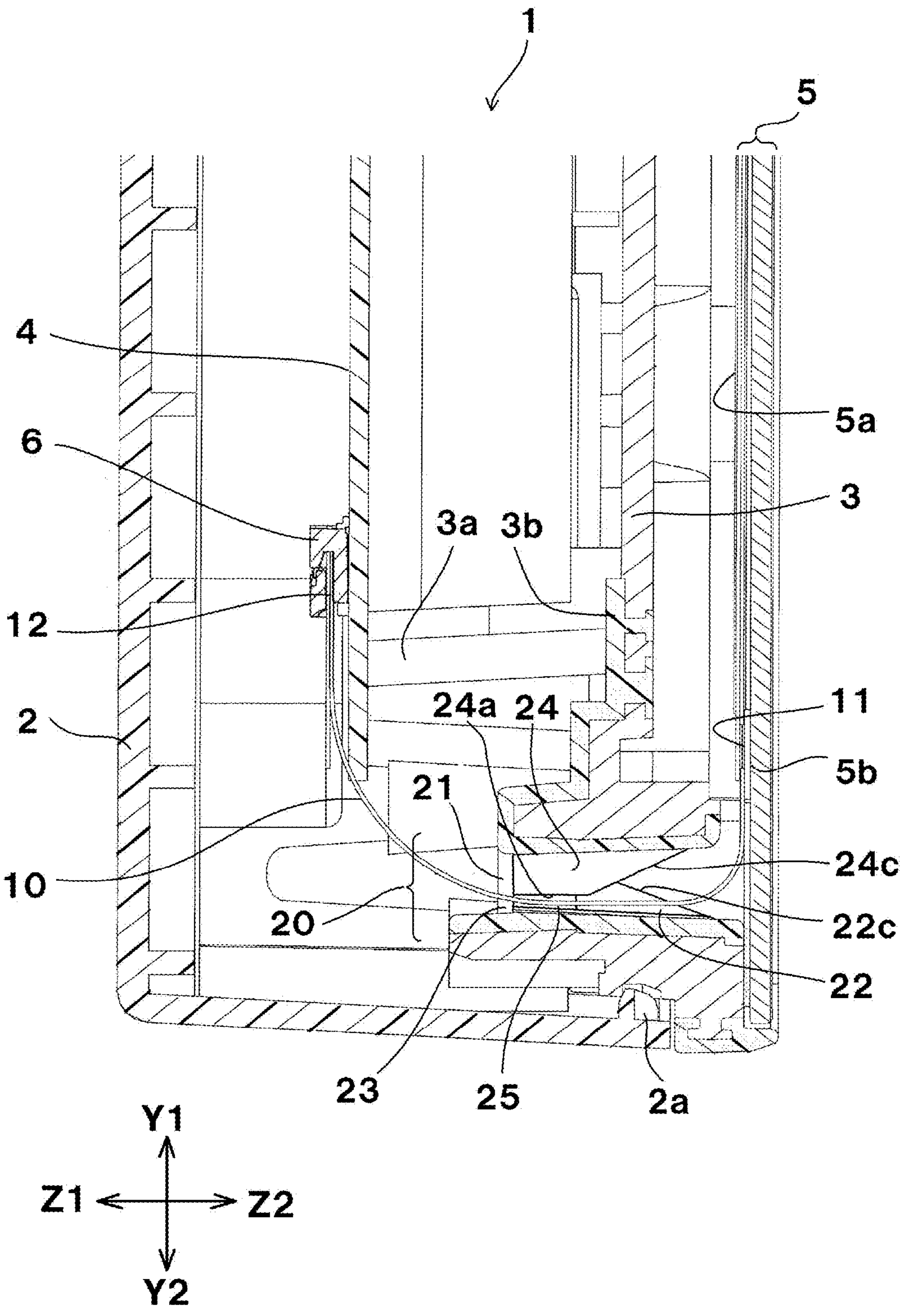
FIG. 2 is a partial cross-sectional view of a restricting device for a flexible wiring board provided in the display device of FIG. 1, taken along line II-II in FIG. 1.

FIGS. 1 and 2 illustrate a display device 1 according to an embodiment in an overall perspective view and a cross-sectional view taken along line II-II in FIG. 1. In each of FIGS. 1 through 10, the Z1 direction corresponds to the inside of the display device, and the Z2 direction corresponds to the outside of the display device. The Z1 direction also corresponds to the front side of the insertion direction of a flexible wiring board, and the Z2 direction also corresponds to the rear side of the insertion direction of a flexible wiring board. The Y1 direction corresponds to the upper side of the display device, and the Y2 direction corresponds to the lower side of the display device. The X1 direction corresponds to the right side of the display device, and the X2 direction corresponds to the left side of the display device.

The display device 1 illustrated in FIGS. 1 and 2 has a main body case 2. The main body case 2 is mainly made of a synthetic resin material, and has a rectangular shape when viewed from the outside of the display device (in the Z2 direction), and as illustrated in FIG. 2, an open portion **2*a* of the main body case 2 is directed to the outside of the display device (in the Z2 direction). A holder 3 is fixed to the main body case 2, and a part of the opening portion 2*a* of the main body case 2 is covered with the holder 3. A display panel 5 is fixed to the outer side (the Z2 side) of the holder 3. A support portion 3*a* extending inward (in the Z1 direction) is integrally formed with the holder 3, and a circuit board 4 is fixed to the support portion 3***a*. Various electronic components are mounted on the circuit board 4, and a connector 6 is mounted on the surface on the inside (the surface on the Z1 side) of the circuit board 4.

The display panel 5 is a liquid crystal display panel, an electroluminescence panel, or the like. The display panel 5 is constituted by a stack of two glass substrates, and a flexible wiring board 10 is connected to an inward-facing (in the Z1 direction) inner surface 5*a* of the display panel 5. As illustrated in FIG. 2, a restricting device 20 for restricting the movement of the flexible wiring board 10 in the inward-outward direction (the Z1-Z2 direction) is provided in the lower inside part of the display device 1. The restricting device 20 is constituted by a part of the holder 3, or by a part of the holder 3 and a part of the flexible wiring board 10.

Figure 3:
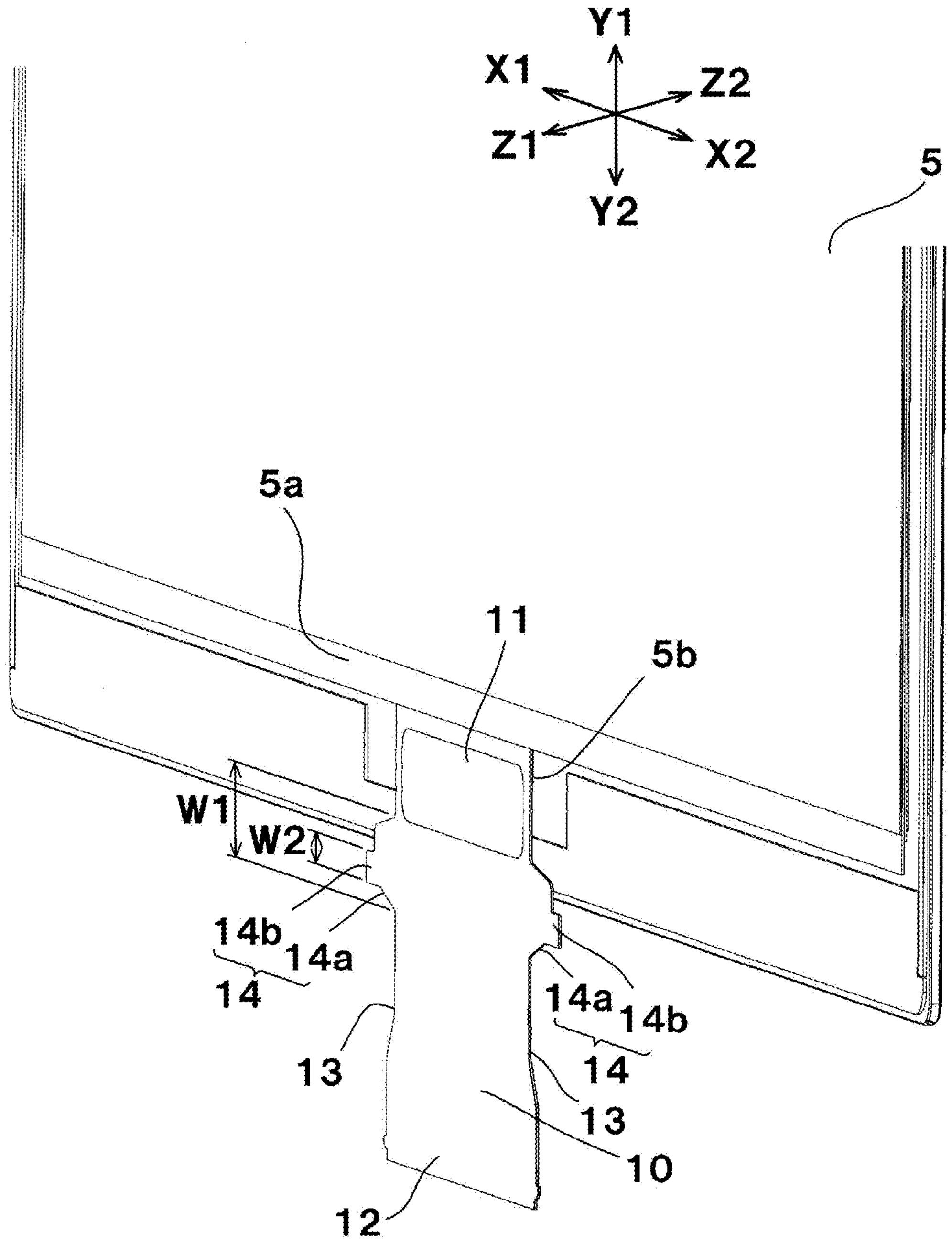
FIG. 3 is a perspective view of a display panel provided in the display device of FIG. 1 viewed from an inner surface side.
Figure 4:
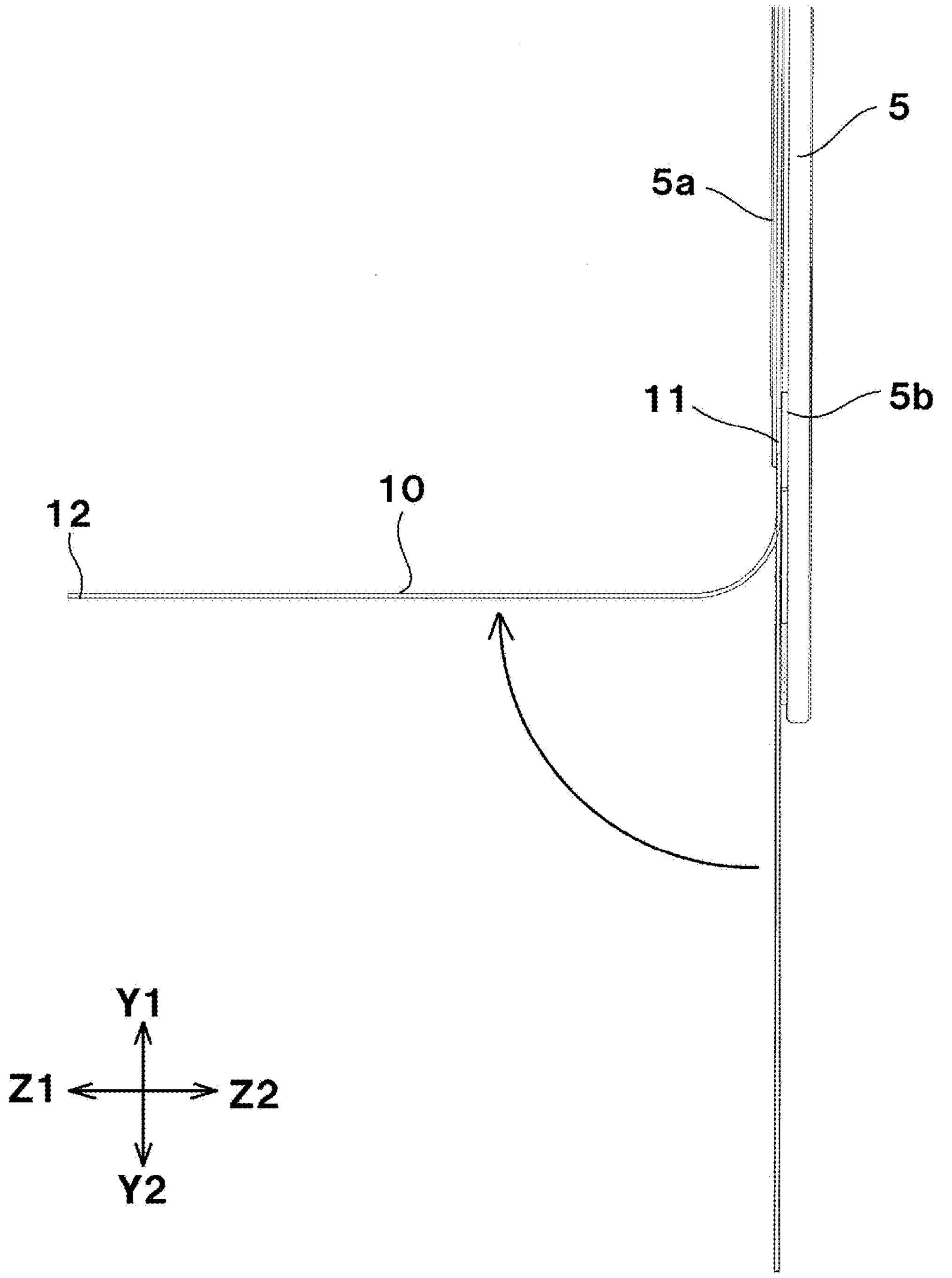
FIG. 4 is a partial side view illustrating a step of bending the flexible wiring board connected to the display panel illustrated in FIG. 3.

As illustrated in FIG. 3, a board connecting portion 5*b* having a plurality of terminals is formed on the surface of the glass plate in the inner surface 5*a* of the display panel 5 facing inward. A base connecting portion 11 is formed at the base end of the flexible wiring board 10, and a plurality of terminals provided on the base connecting portion 11 are respectively fixed to the terminals of the board connecting portion 5*b* by soldering. A connector connecting terminal 12 is formed at the front end of the flexible wiring board 10. A plurality of interconnect layers for electrically connecting the base connecting portion 11 and the connector connecting terminal 12 are provided on the board surface of the flexible wiring board 10. As illustrated in FIG. 4, in an initial stage of the assembling process of the display device 1, the flexible wiring board 10 is bent at an angle of about 90° from the inner surface 5*a* of the display panel 5 by using a jig, so that the connector connecting terminal 12 is directed inward (in the Z1 direction). The display panel 5 is mounted on the holder 3 in the orientation illustrated in FIGS. 4 and 5, and the flexible wiring board 10 is inserted into the restricting device 20 in the orientation along the board surface. The Z1 direction is an insertion direction in which the flexible wiring board 10 is inserted toward the holder 3.

As illustrated in FIG. 3, the flexible wiring board 10 is integrally formed with edge portions 13 respectively located at the side portions in the width direction (the X1-X2 direction) intersecting the insertion direction (the Z1 direction in FIG. 4), and protruding portions 14 protruding outward from the respective edge portions 13 in the widthwise direction (the X1-X2 direction). The "side portions" of the flexible wiring board 10 refer to the portions including the edge portions 13 and the protruding portions 14. Each of the protruding pieces 14 has a thick piece portion 14*a* protruding outward from the edge portion 13 and having a large width dimension W1 in the insertion direction, and a thin piece portion 14*b* protruding further outward from the thick piece portion 14*a* and having a width dimension W2 in the insertion direction smaller than the width dimension W1. The shapes of the thick piece portion 14*a* and the thin piece portion 14*b* are illustrated in FIG. 9 in an enlarged manner.

Figure 5:
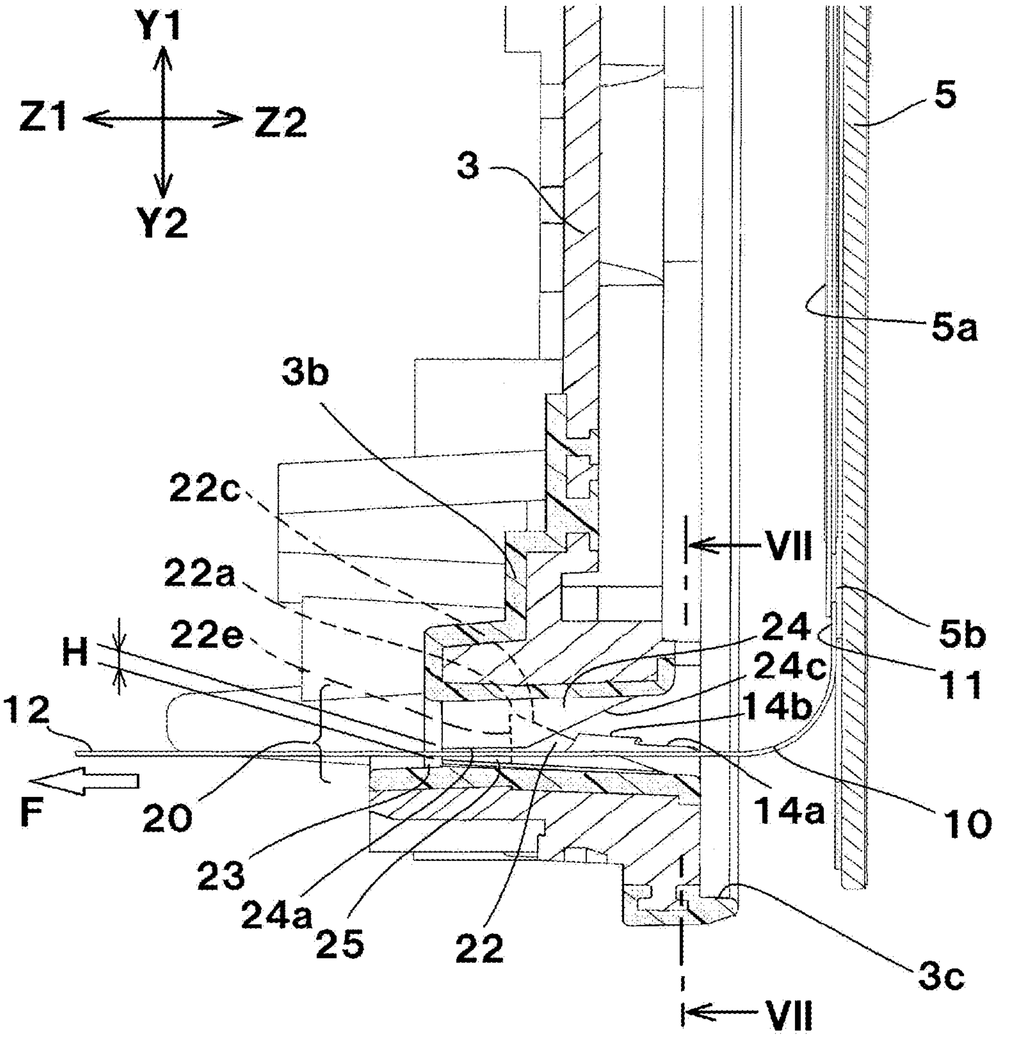
FIG. 5 is a partial side view illustrating a step of inserting the flexible wiring board bent in the step illustrated in FIG. 4 into an insertion portion included in the restricting device in a holder.
Figure 6:
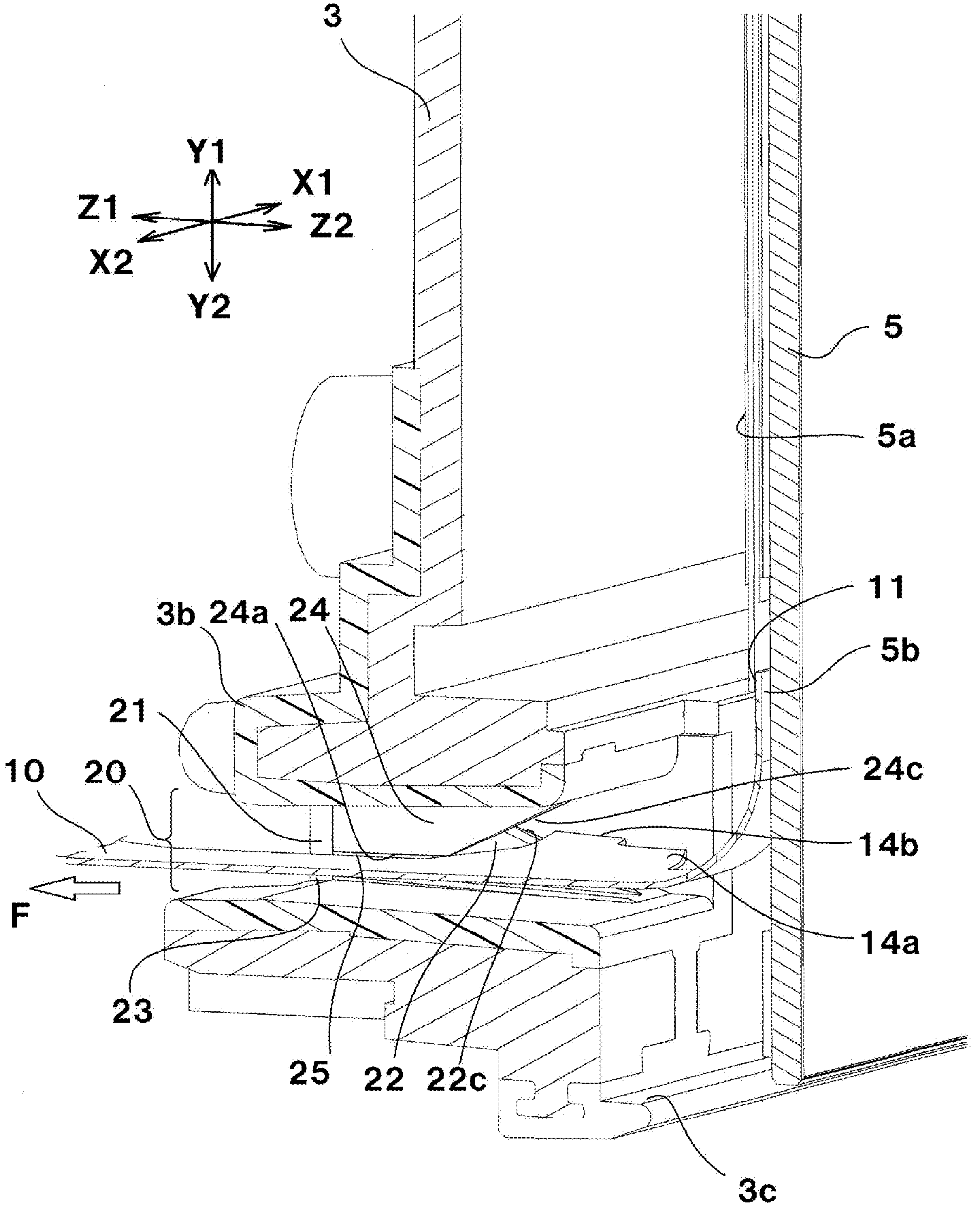
FIG. 6 is a partial cross-sectional perspective view illustrating, similarly to FIG. 5, a step of inserting the flexible wiring board into the insertion portion.

FIGS. 2, 5, and 6 are cross-sectional views illustrating the structure of the restricting device 20 for restricting and positioning the flexible wiring board 10 inserted in the Z1 direction. In the restricting device 20, an insertion portion 21 is formed in the holder 3. The insertion portion 21 is a through hole having a rectangular cross section and penetrating the holder 3 in the inward-outward direction (the Z1-Z2 direction). The holder 3 is made of a conductive metal material, and the insertion of the flexible wiring board 10 into the insertion portion 21 formed in such a metal-made holder 3 allows the display device to easily satisfy the requirement of electromagnetic compatibility (EMC). The holder 3 is provided with a synthetic resin material layer 3*b* covering the metal material at least in a portion where the insertion portion 21 is formed.

FIGS. 2, 5, 6, 7, and thereafter illustrate a guide structure for the right-side portion of the insertion portion 21, namely, a portion into which the right-side (X1-side) portion of the flexible wiring board 10 is inserted. The structure of the insertion portion 21 is bilaterally symmetrical, and a guide structure bilaterally symmetrical to the guide structure on the right side is provided on the left side (the X2 side) of the insertion portion 21.

Figure 7:
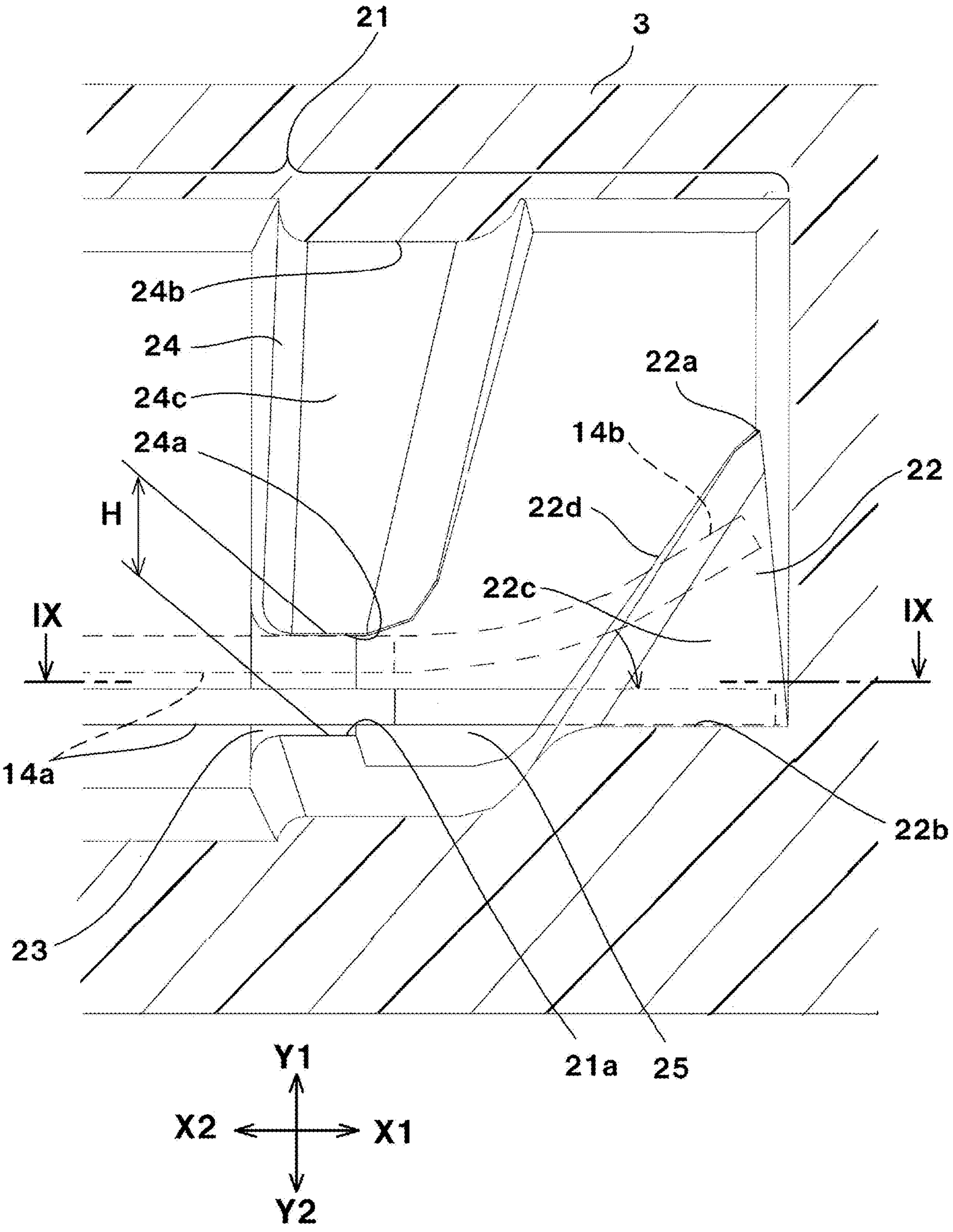
FIG. 7 is a front view, partially including a cross section viewed from the front of the display device, of a step of inserting the flexible wiring board into the insertion portion, similarly to FIGS. 5 and 6, and a step of inserting a protruding portion of the flexible wiring board into a restricting region of the restricting device.
Figure 8:
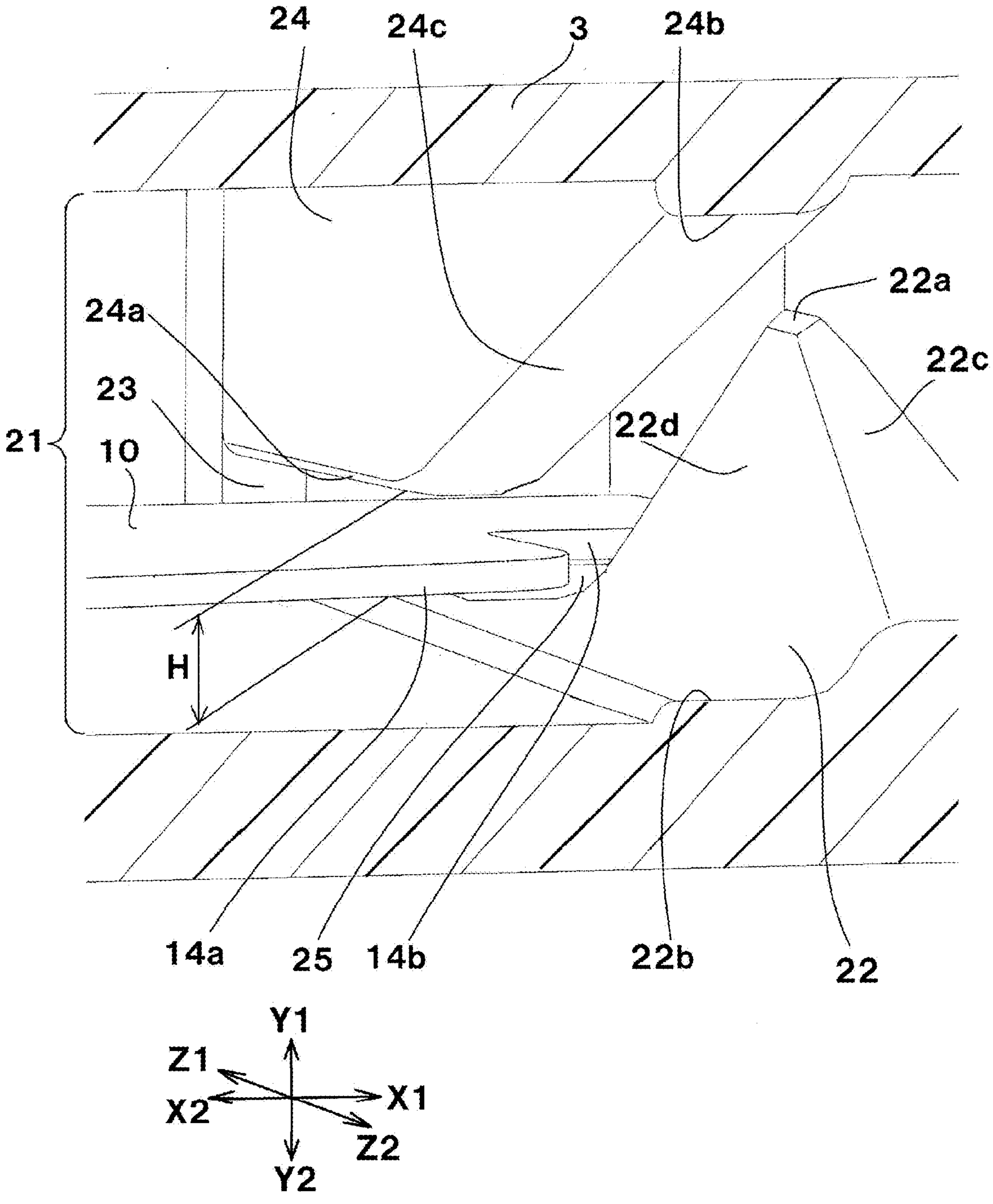
FIG. 8 is a perspective view illustrating a process in which a protruding portion of the flexible wiring board enters the restricting region of the restricting device, which is obtained by viewing the front view of FIG. 7 slightly obliquely from the left side.
Figure 9:
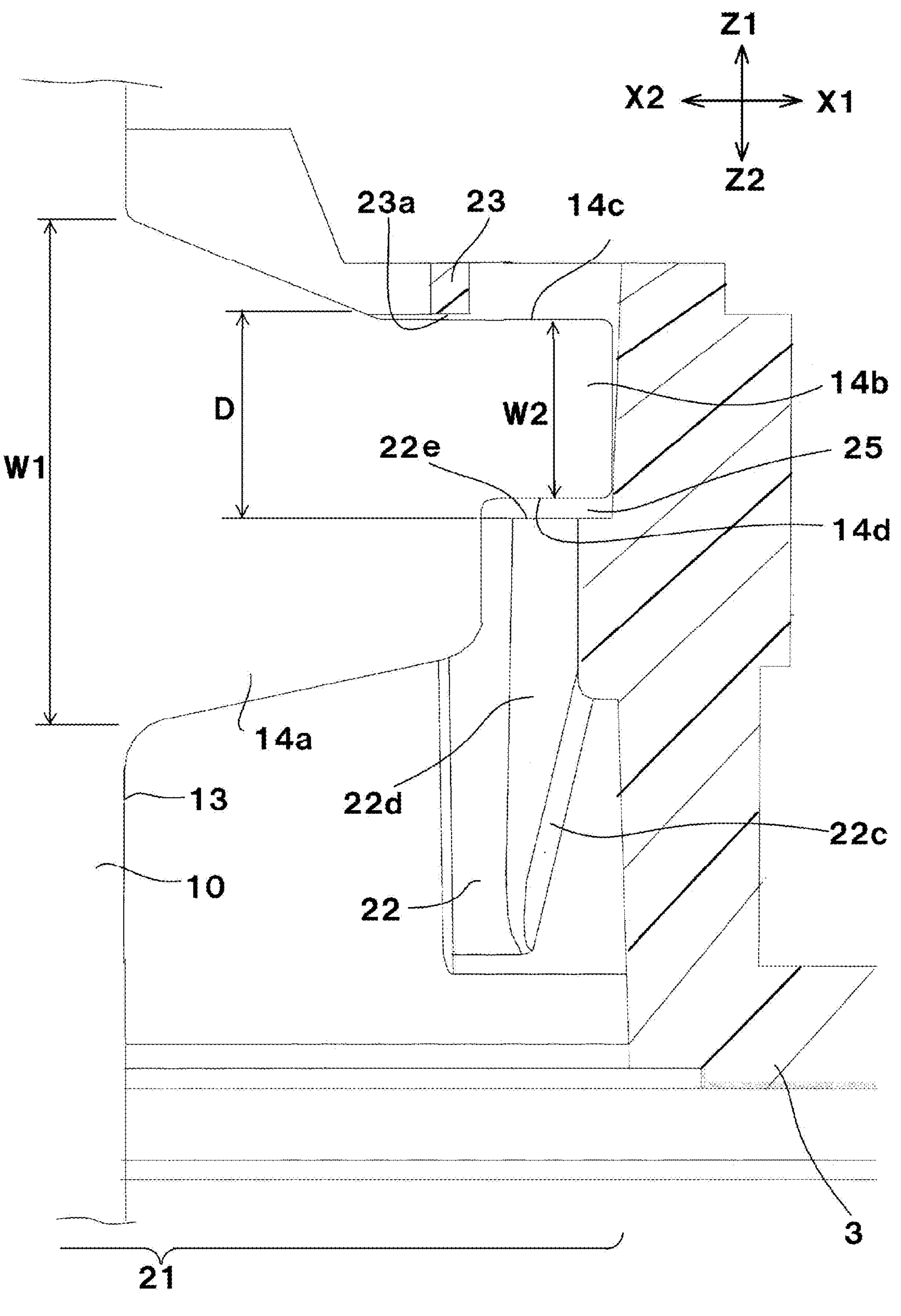
FIG. 9 is a sectional view taken along line IX-IX in FIG. 7, illustrating a step in which the protruding portion of the flexible wiring board enters the restricting region of the restricting device.

As illustrated in FIGS. 8 and 9 in an enlarged manner, a rear restricting portion 22 positioned on the outer side (the Z2 side) and a front restricting portion 23 positioned on the inner side (the Z1 side) are provided inside the insertion portion 21 as a guide structure for guiding the side portion of the flexible wiring board 10. As illustrated in FIGS. 7 and 8, in the guide structure, an inner restricting portion 24 is provided on the inner side in the width direction of the flexible wiring board 10 with respect to the rear restricting portion 22. The rear restricting portion 22, the front restricting portion 23, and the inner restricting portion 24 are formed by a part of the synthetic resin material layer 3*b* that covers the metallic material forming the holder 3.

As illustrated in FIGS. 7 and 8, the rear restricting portion 22 protrudes in the thickness direction of the inserted flexible wiring board 10, and the inner restricting portion 24 protrudes in the thickness direction of the flexible wiring board 10 but in the direction opposite to the protrusion of the rear restricting portion 22. In the insertion portion 21 of the embodiment, the rear restricting portion 22 protrudes upward (in the Y1 direction), and the inner restricting portion 24 is provided further inward than the rear restricting portion 22 and protrudes downward (in the Y2 direction). As illustrated in FIGS. 7 and 8, the downward-protruding vertex portion 24*a* of the inner restricting portion 24 is located at an intermediate height position between the vertex portion 22*a* and the base portion 22*b* of the rear restricting portion 22. As illustrated in FIG. 5, when viewed from either the left or right direction (the X1 direction or the X2 direction), a portion including the vertex portion 22*a* of the rear restricting portion 22 and a portion including the vertex portion 24*a* of the inner restricting portion 24 overlap each other. As illustrated in FIG. 7, when viewed from the front, the rear restricting portion 22 and the inner restricting portion 24 extend alternately in the vertical direction (the Y1-Y2 direction) at positions separated in the lateral direction (the X1-X2 direction).

As illustrated in FIG. 9, a wall portion of the rear restricting portion 22 facing frontward (in the Z1 direction) is a rear restricting wall portion 22*e*, and a wall portion of the front restricting portion 23 facing rearward (in the Z2 direction) is a front restricting wall portion 23*a*. The facing distance D between the rear restricting wall portion 22*e* and the front restricting wall portion 23*a* in the inward-outward direction of the display device is slightly larger than the width dimension W2 of the thin piece portion 14*b* of the protruding portion 14 formed on the flexible wiring board 10 in the front-rear direction. As illustrated in FIG. 7, a space having a height H is formed between a lower inner wall portion 21*a* of the insertion portion 21 and the vertex portion 24*a* of the inner restricting portion 24, and the front restricting wall portion 23*a* of the front restricting portion 23 is located in front of the space having the height H. Furthermore, the space having the height H is located below the vertex portion 22*a* of the rear restricting portion 22. The space having the facing distance D between the front restricting wall portion 23*a* and the rear restricting wall portion 22 is a restricting region 25. Alternatively, the space having the facing distance D and the space having the height H are the restricting region 25. The restricting region 25 means a region between the rear restricting portion 22 and the front restricting portion 23, or a region between the rear restricting portion 22 and the front restricting portion 23 and between the vertex portion 24*a* of the inner restricting portion 24 and the lower inner wall portion 21*a* of the insertion portion 21.

As illustrated in FIGS. 8 and 9, a wall of the rear restricting portion 22 facing outward (in the Z2 direction) is formed with an inclined portion 22*c* inclined frontward in the insertion direction and spanning from a base portion 22*b* to a vertex portion 22*a* of the rear restricting portion 22. As illustrated in FIGS. 7 and 8, a wall portion of the rear restricting portion 22 facing inside (the X2 side) is formed with an inclined portion 22*d* inclined in a direction away from the edge portion 13 of the flexible wiring board 10 (in the X1 direction) and spanning from the base portion 22*b* to the vertex portion 22*a*. As illustrated in FIG. 8, a wall of the inner restricting portion 24 facing outward (in the Z2 direction) is formed with an inclined portion 24*c* inclined toward the front of the insertion direction (in the Z1 direction) and spanning from a base portion 24*b* to a vertex portion 24*a* of the inner restricting portion 24.

Next, an assembly process (assembly method) of the display device 1 and a restriction process (restriction method) of the flexible wiring board 10 in the restricting device 20 is described. As illustrated in FIG. 3, the flexible wiring board 10 is in a flat plate shape in a free state, and the base connecting portion 11 is soldered to the board connecting portion 5*b* formed on the inner surface 5*a* of the display panel 5. In the assembling process of the display device 1, first, as illustrated in FIG. 4, the flexible wiring board 10 connected to the inner surface 5*a* of the display panel 5 is bent at substantially 90° inward (in the Z1 direction) from the inner surface 5*a* of the display panel 5. A jig is used for this bending operation.

Next, as illustrated in FIG. 5, the display panel 5 is fitted into the frame portion 3*c* of the holder 3 facing outward (in the Z2 direction) while inserting the flexible wiring board 10 facing inward (in the Z1 direction) into the insertion portion 21 included in the restricting device 20 in the holder 3, and the display panel 5 is fixed to the holder 3 by means of fitting or screwing through recesses and projections. In this step, as illustrated in FIG. 5, the front end of the flexible wiring board 10 facing the Z1 direction is held by a jig, and a pulling force F is applied to the front end, whereby the flexible wiring board 10 is forcibly fed into the inner side (in the Z1 direction) in the insertion portion 21.

As illustrated in FIGS. 5 and 6, the main body portion of the flexible wiring board 10 inserted into the insertion portion 21, except for the left and right protruding portions 14, passes between the left and right front restricting portions 23 and is fed into the inner side (in the Z1 direction). While the flexible wiring board 10 is being pulled inward, the tip portions of the protruding portions 14 protruding laterally outward, i.e., the thin piece portions 14*b*, abut to the inclined portions 22*c* of the rear restricting portions 22 located on the left and right sides of the insertion portion 21, which are inclined outward (in the Z2 direction), and the thin piece portions 14*b* are guided upward by sliding on the inclined portions 22*c* as the flexible wiring board 10 is pulled inward (in the Z1 direction).

While the flexible wiring board 10 is further moved inward (in the Z1 direction) from the position illustrated in FIGS. 5 and 6, the protruding portions 14 are guided downward (in the Y2 direction) by the inclined portions 24*c* of the inner restricting portions 24 facing outward (in the Z2 direction), and are guided into the space having the distance H formed between the lower inner wall portion 21*a* of the insertion portion 21 and the vertex portions 24*a* of the inner restricting portions 24. As illustrated by the dashed line in FIG. 7, the thin piece portions 14*b* of the protruding portions 14 slide up the inclined portions 22*c* of the rear restricting portions 22, and the portions located inside the thin piece portions 14*b* with respect to the width direction, for example the thick piece portions 14*a*, are pressed from above by the vertex portions 24*a* of the inner restricting portions 24, whereby the protruding portions 14 are pulled inward (in the Z1 direction) while being bent, so that the thin piece portions 14*b* face upward. Since the thin piece portions 14*b* have a short width dimension W2 in the front-rear direction and have a lower rigidity than other portions, the thin piece portions 14*b* can bend as indicated by the dashed line in FIG. 7 without generating a large resistance force when the flexible wiring board 10 is pulled inward (in the Z1 direction).

Furthermore, after the flexible wiring board 10 is further pulled in the Z1 direction by the jig, the thin piece portions 14*b* of the protruding portions 14, which are moving inward (in the Z1 direction) while sliding up the inclined portions 22*c* of the rear restricting portions 22, ride over the vertex portions 22*a* of the rear restricting portions 22 and come off from the vertex portions 22*a*, and the protruding portions 14 in the bent state as illustrated by the dashed line in FIG. 7 recover their flat state as illustrated by the solid line in FIG. 7 because of their elastic resilience. As illustrated in FIGS. 7 and 8, the wall portions of the rear restricting portions 22 facing the inside (the X2 side) are formed with an inclined portions 22*d* inclined in a direction away from the edge portions 13 of the flexible wiring board 10 (the X1 direction) from the base portions 22*b* to the vertex portion 22*a*, and as illustrated in FIGS. 8 and 9, the inclined portions 22*c* of the rear restricting portions 22 facing outward (in the Z2 direction) are gradually narrowed in the left-right direction (the X1-X2 direction) from the base portions 22*b* toward the vertex portions 22*a*. Therefore, the thin piece portions 14*b* sliding up on the inclined portions 22*c* of the rear restricting portions 22 are easily detached from the vertex portions 22*a* when reaching the vicinity of the vertex portions 22*a* of the rear restricting portions 22.

As illustrated in FIGS. 8 and 9, each of the protruding portions 14 that has recovered a flat state enter the restricting region 25 between the rear restricting wall portion 22*e* and the front restricting wall portion 23*a* (the facing distance D) and between the vertex portion 24*a* of the inner restricting portion 24 and the lower inner wall portion 21*a* (the height H). The front edge 14*c* of each of the protruding portion 14 that has entered the restricting region 25 is restricted by the front restricting wall portion 23*a* of the front restricting portion 23 so as not to move inward (in the Z1 direction), and the rear edge 14*d* of the protruding portion 14 is restricted by the rear restricting wall portion 22*e* of the rear restricting portion 22 so as not to move outward (in the Z2 direction). Furthermore, the downward-facing vertex portion 24*a* of each of the inner restricting portions 24 is at an intermediate height between the vertex portion 22*a* and the base portion 22*b* of the rear restricting portion 22, and the rear restricting wall portion 22*e* is at a position overlapping the inner restricting portion 24 in the left-right direction (the X1-X2 direction) as illustrated in FIG. 5. Therefore, the upward movement of the protruding portions 14 is suppressed, and the protruding portions 14 are prevented from easily coming out of the restricting regions 25.

In the process of assembling the display panel 5 to the holder 3, as illustrated in FIG. 5, the left and right protruding portions 14 are made to pass over the rear restricting portions 22 and automatically fitted into the restricting regions 25 only by inserting inward the flexible wiring board 10 into the insertion portion 21 included in the restricting device 20 and applying a pulling force F to the flexible wiring board 10 from the inside of the holder 3. For this reason, it is possible to restrict excessive moving of the flexible wiring board 10 in the front-rear direction (the Z1-Z2 direction) in the holder 3 and position the flexible wiring board 10, without a need of a complicated assembly process, such as inserting the hand-bent flexible wiring board 10 into a slit or inserting the flexible wiring board 10 into a notch or a hole while bending the board by hand.

In the process of attaching the display panel 5 to the holder 3, after the protruding portions 14 of the flexible wiring board 10 inserted into the insertion portion 21 are both fitted into the restricting regions 25 inside the insertion portion 21, the flexible wiring board 10 is slightly bent to fix the display panel 5 to the frame portion 3*c* of the holder 3 facing outward (in the Z2 direction). In the partially assembled state in which the display panel 5 is fixed to the holder 3, the distances between the protruding portions 14 restricted in the restricting region 25 and the connecting portion between the inner surface 5*a* of the display panel 5 and the base connecting portion 11 are maintained. For this reason, even if the front end of the flexible wiring board 10 protruding inward (in the Z1 direction) from the holder 3 is pulled in the Z1 direction or pushed in the Z2 direction, it is possible to prevent an excessive force from acting on the connecting portion between the inner surface 5*a* of the display panel 5 and the base connecting portion 11.

Before or after the display panel 5 is attached to the holder 3, the circuit board 4 illustrated in FIG. 2 is fixed to the support portion 3*a* extending inward (in the Z1 direction) from the holder 3. The connector connecting terminal 12 at the front end of the flexible wiring board 10 is connected to the connector 6 mounted on the circuit board 4. At this time, even if a pulling force in the Z1 direction or a pushing force in the Z2 direction is applied to the flexible wiring board 10, an excessive force does not act on the connecting portion between the inner surface 5*a* of the display panel 5 and the base connecting portion 11.

As illustrated in FIG. 2, in the assembling process of the display device 1, the holder 3 integrated with the display panel 5 is fixed to the opening portion 2*a* of the main body case 2. The fixing means at this time is fitting through recesses and projections, screw fastening, or the like.

Figure 10:
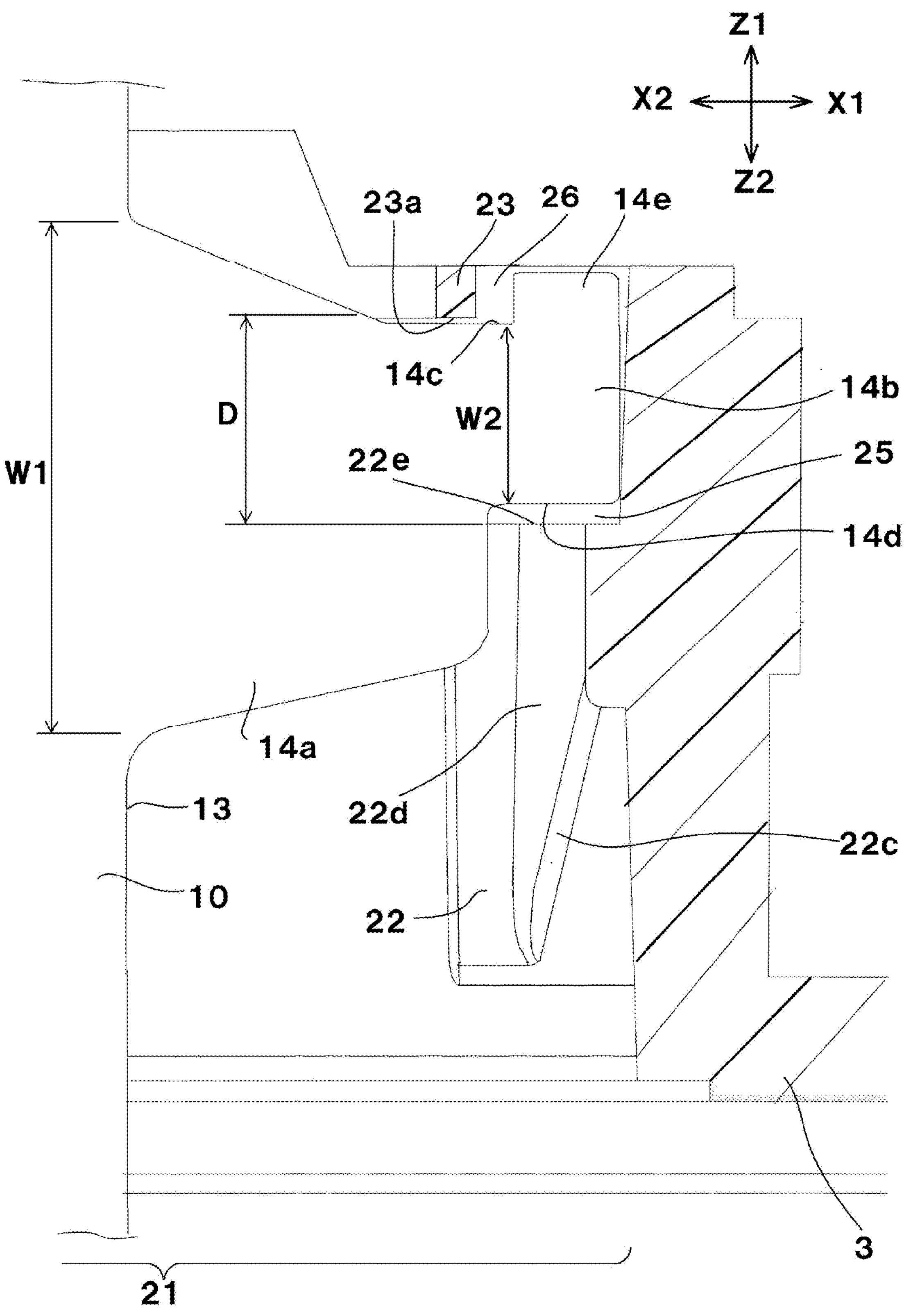
FIG. 10 is a sectional view similar to FIG. 9, illustrating a modification of the restricting device for a flexible wiring board according to the embodiment.

FIG. 10 illustrates a modification of the restricting device 20 of the present disclosure. In the restricting device 20 of this modification, the insertion portion 21 formed in the holder 3 is provided with a front opening 26 adjacent to the front restricting portion 23. The front opening 26 is open at a farther outward position than the front restricting portion 23 with respect to the edge portion 13 of the flexible wiring board 10. The protruding portion 14 of the flexible wiring board 10 is provided with a front protruding piece 14*e* that protrudes from the thin piece portion 14*b* toward the front in the insertion direction (in the Z1 direction). If the protruding portion 14 enters the restricting region 25 of the insertion portion 21, the front protruding piece 14*e* enters the front opening 26. The entrance of the front protruding piece 14*e* into the inside of the front opening 26 makes it more difficult for the protruding portion 14 to come out of the restricting region 25, and facilitates stabilizing the protruding portion 14 in a state of being fitted into the inside of the restricting region 25.

The insertion portion 21 of the restricting device 20 of the embodiment is formed as a rectangular hole penetrating the holder 3 in the inward-outward direction; it suffices that the insertion portion 21 has a structure in which, for example, a central portion in the left-right direction is opened upward (in the Y1 direction) as long as the rear restricting portion 22 and the front restricting portion 23, and the inner restricting portion 24 and the restricting region 25 are formed on each of the left and right sides. The structure of FIG. 7 may be reversed, that is, the rear restricting portions 22 may protrude downward (in the Y2 direction) and the inner restricting portions 24 may protrude upward (in the Y1 direction).

What is claimed is:

1. A restricting device for a flexible wiring board, the restricting device comprising:
- an insertion portion into which at least both side portions of the flexible wiring board are inserted in a direction along a board surface of the flexible wiring board, wherein the side portions of the flexible wiring board are formed with
  - edge portions positioned on respective sides in a width direction intersecting an insertion direction in which the flexible wiring board is inserted into the insertion portion, and
  - protruding portions protruding from the respective edge portions outward in the width direction,
- the insertion portion including
  - a rear restricting portion protruding in a thickness direction of the flexible wiring board,
  - a front restricting portion located forward of the rear restricting portion in the insertion direction,
  - a restricting region formed between the front restricting portion and the rear restricting portion, and
  - an inner restricting portion located further inward than the rear restricting portion with respect to a width direction of the flexible wiring board and protruding in a direction opposite to a protruding direction of the rear restricting portion, wherein
- a protruding portion passes over the rear restricting portion and is restricted from moving in a front-rear direction in the restricting region while the flexible wiring board is being inserted into the insertion portion, the protruding portion being from the protruding portions.

2. The restricting device for a flexible wiring board according to claim 1, wherein
- a vertex portion of the inner restricting portion is located at an intermediate height position between a vertex portion and a base portion of the rear restricting portion, and
- while the flexible wiring board being inserted into the insertion portion, a tip portion of the protruding portion is abutted to the rear restricting portion, and a portion located further inward than the tip portion with respect to a width direction is abutted to the inner restricting portion and is thereby bent and deformed, and
- in an insertion process, the protruding portion enters the restricting region by an elastic resilience force caused by a disengagement of the front end from the rear restricting portion.

3. The restricting device for a flexible wiring board according to claim 2, wherein the rear restricting portion is formed with an inclined portion inclined forward in the insertion direction from the base portion to the vertex portion of the rear restricting portion.

4. The restricting device for a flexible wiring board according to claim 2, wherein the tip portion of the protruding portion is formed with a thin piece portion having a reduced dimension in the front-rear direction, and the thin piece portion is abutted to the rear restricting portion.

5. The restricting device for a flexible wiring board according to claim 4, wherein the thin piece portion is formed with a front protruding piece protruding forward, the insertion portion is formed with a front opening aligned with the front restricting portion, and the front protruding piece is positioned in the front opening as the protruding portion enters the restricting region.

6. A display device comprising:

a holder;

a display panel fixed to the holder; and the restricting device for a flexible wiring board of claim 1, wherein the flexible wiring board is inserted into the insertion portion and restricted, being bent at the display panel toward the holder.

* * * * *